United States Patent
Roelofs et al.

(10) Patent No.: US 8,830,734 B2
(45) Date of Patent: Sep. 9, 2014

(54) USING A NEARBY CELL TO PROVIDE FIELD ASSISTED SWITCHING IN A MAGNETIC MEMORY ARRAY

(75) Inventors: Andreas Karl Roelofs, Eden Prairie, MN (US); Haiwen Xi, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 245 days.

(21) Appl. No.: 12/950,673

(22) Filed: Nov. 19, 2010

(65) Prior Publication Data

US 2012/0127785 A1 May 24, 2012

(51) Int. Cl.
*G11C 11/00* (2006.01)
*G11C 11/16* (2006.01)

(52) U.S. Cl.
CPC ............ *G11C 11/1675* (2013.01); *G11C 11/16* (2013.01)
USPC .......................................... 365/158; 365/173

(58) Field of Classification Search
CPC .............................. G11C 11/1675; G11C 11/16
USPC ........... 365/158, 148, 163, 161, 173; 158/158
See application file for complete search history.

(56) References Cited

U.S. PATENT DOCUMENTS

| | | | |
|---|---|---|---|
| 6,714,444 B2 | 3/2004 | Huai et al. | |
| 7,075,818 B2 * | 7/2006 | Ju | 365/158 |
| 7,180,770 B2 | 2/2007 | Perner et al. | |
| 7,241,631 B2 | 7/2007 | Huai et al. | |
| 7,242,045 B2 | 7/2007 | Nguyen et al. | |
| 7,248,497 B2 * | 7/2007 | Saito et al. | 365/158 |
| 7,310,265 B2 | 12/2007 | Zheng et al. | |
| 7,372,116 B2 | 5/2008 | Fullerton et al. | |
| 7,486,552 B2 | 2/2009 | Apalkov et al. | |
| 7,525,862 B1 * | 4/2009 | Sun et al. | 365/225.5 |
| 7,800,942 B2 * | 9/2010 | Chen et al. | 365/173 |
| 7,804,710 B2 * | 9/2010 | Reohr | 365/173 |
| 8,422,287 B2 * | 4/2013 | Min et al. | 365/172 |
| 2008/0154519 A1 | 6/2008 | Zhou et al. | |
| 2008/0291720 A1 | 11/2008 | Wang et al. | |
| 2008/0291721 A1 | 11/2008 | Apalkov et al. | |
| 2010/0034008 A1 | 2/2010 | Wang et al. | |
| 2012/0111952 A1 * | 5/2012 | Cao et al. | 235/492 |

OTHER PUBLICATIONS

L. Berger, "Emission of spin waves by a magnetic multilayer traversed by a current," Physical Review B, Oct. 1, 1996, pp. 9353-9358, vol. 54, No. 13, The American Physical Society, USA.
J. C. Slonczewski, "Current-driven excitation of magnetic multilayers," Journal of Magnetism and Magnetic Materials, 1996, pp. L1-L7, Elsevier Science.
J. Z. Sun, "Spin-current interaction with a monodomain magnetic body: A model study," Physical Review B, Jul. 1, 2000, pp. 570-578, vol. 62, No. 1, The American Physical Society, USA.

* cited by examiner

*Primary Examiner* — Kretelia Graham
(74) *Attorney, Agent, or Firm* — Hall Estill Attorneys at Law

(57) ABSTRACT

Method and apparatus for writing data to a magnetic memory cell, such as a spin-torque transfer random access memory (STRAM) memory cell. In accordance with various embodiments, a write current is applied through a selected magnetic memory cell to initiate magnetic precession of the selected cell to a desired magnetic state. A field assist current is concurrently flowed through an adjacent memory cell to generate a magnetic field that assists in the precession of the selected cell to the desired magnetic state.

23 Claims, 4 Drawing Sheets

USING A NEARBY CELL TO PROVIDE FIELD ASSISTED SWITCHING IN A MAGNETIC MEMORY ARRAY

SUMMARY

Various embodiments of the present invention are generally directed to a method and apparatus for writing data to a magnetic memory cell, such as a spin-torque transfer random access memory (STRAM) memory cell.

In accordance with various embodiments, a write current is applied through a selected magnetic memory cell to initiate magnetic precession of the selected cell to a desired magnetic state. A field assist current is concurrently flowed through an adjacent memory cell to generate a magnetic field that assists in the precession of the selected cell to the desired magnetic state.

These and various other features and advantages which characterize the various embodiments of the present invention can be understood in view of the following detailed discussion and the accompanying drawings.

DETAILED DESCRIPTION

The present disclosure sets forth improvements in the manner in which data may be written to magnetic memory cells, such as but not limited to spin-torque transfer random access memory (STRAM) cells.

An array of solid-state magnetic memory cells can be used to provide non-volatile storage of data bits. Some magnetic memory cell configurations include a programmable resistive element, such as a magnetic tunneling junction (MTJ). An MTJ includes a pinned reference layer having a fixed magnetic orientation in a selected direction. A free layer is separated from the reference layer by a tunneling barrier, with the free layer having a selectively variable magnetic orientation. The orientation of the free layer relative to the fixed layer establishes an overall electrical resistance of the cell, which can be detected during a read sense operation.

While magnetic memory cells have been found to efficiently store data in a compact semiconductor array environment, one issue related to such cells is the power required to produce the different programmed states. For example, STRAM cells are often configured to use spin torque to change the magnetic orientation of the free layer, thereby requiring the application of write currents through the MTJ with significant current density levels. This can in turn require a relatively large switching device (e.g., nMOSFET) for each cell to accommodate such large current densities.

Reducing the current densities required to switch the free layer in each cell generally tends to reduce the overall power consumption of a storage device, which can reduce heat generation, and extend battery life in battery operated applications. Lower switching current densities can also allow the use of smaller switching devices in the individual memory cells, thereby promoting more densely packed, higher data capacity arrays.

Accordingly, the present disclosure is generally directed to field assisted writing of data to magnetic memory cells to reduce programming current densities. As explained below, a write current is applied to a selected memory cell in an array to effect a selected programmed state. A field assist current is concurrently applied to at least one nearby cell in the array. The field assist current is not sufficiently large to affect the programmed state of the nearby cell, but is sufficiently large to establish an Ampere field that aids the programming effort upon the selected cell. It is contemplated that the use of such field assist currents will lower the overall power consumption levels of the array and provide faster, lower current switching operations.

Figure 1:
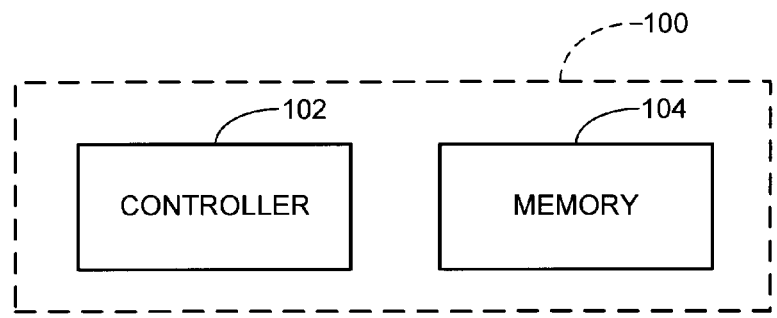
FIG. 1 provides a functional block representation of a data storage device constructed and operated in accordance with various embodiments of the present invention.

FIG. 1 provides a simplified block representation of a data storage device 100 constructed and operated in accordance with various embodiments of the present invention. It is contemplated that the device constitutes a memory card that can be mated with a portable electronic host device to provide data storage for the device. It will be appreciated, however, that the claimed subject matter is not so limited.

The device 100 is shown to include a controller 102 and a memory module 104. The controller 102 provides top level control of the device including interface operations with the host (not separately shown). The controller functionality may be realized in hardware or via a programmable processor, or may be incorporated directly into the memory module 104. Other features may be incorporated into the device 100 as well including but not limited to an I/O buffer, ECC circuitry and local controller cache.

Figure 2:
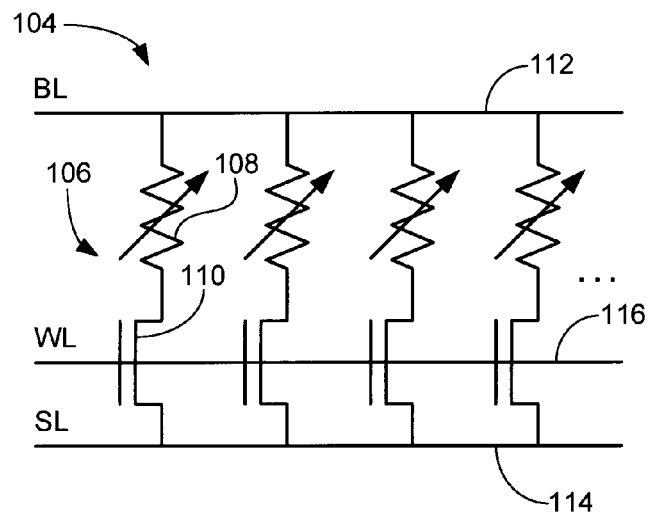
FIG. 2 depicts a portion of the memory module of FIG. 1.

The memory module 104 also referred to herein as a "memory array" or simply "array", includes solid-state non-volatile memory cells 106 as generally illustrated in FIG. 2. Each cell 106 includes a resistive sense memory element 108 and a switching device 110. The memory elements 108 are represented in FIG. 2 as variable resistors, in that the elements will establish different electrical resistances responsive to programming inputs to the cells. The switching devices 110 facilitate selective access to the individual cells during read and write operations.

In some embodiments, the memory cells 106 are characterized as spin-torque transfer random access memory (STRAM) cells. The memory elements 108 are characterized as magnetic tunneling junctions (MTJs), and the switching devices are characterized as nMOSFETs (n-channel metal oxide semiconductor field effect transistors). It will be appreciated that other cell configurations can readily be used.

Access to the cells 106 is carried out through the use of various control lines, including bit lines (BL) 112, source lines (SL) 114 and word lines (WL) 116. All of the cells 106 along a selected word line 116 may form a page of memory that is currently accessed during read and write operations. The array may include any number of MxN memory cells arranged in rows and columns, where M and N are plural numbers with the number M representing the number of rows and the number N representing the number of columns. A cross-point array can be used in which only two control lines are directly coupled to each cell.

The various bit, source and control lines 112, 114 and 116 represented in FIG. 2 extend orthogonally across the array, and may be parallel or perpendicular to each other as required. Suitable driver circuitry (not shown) is coupled to the various control lines to pass selected read and write currents through the individual cells 106.

Figure 3:
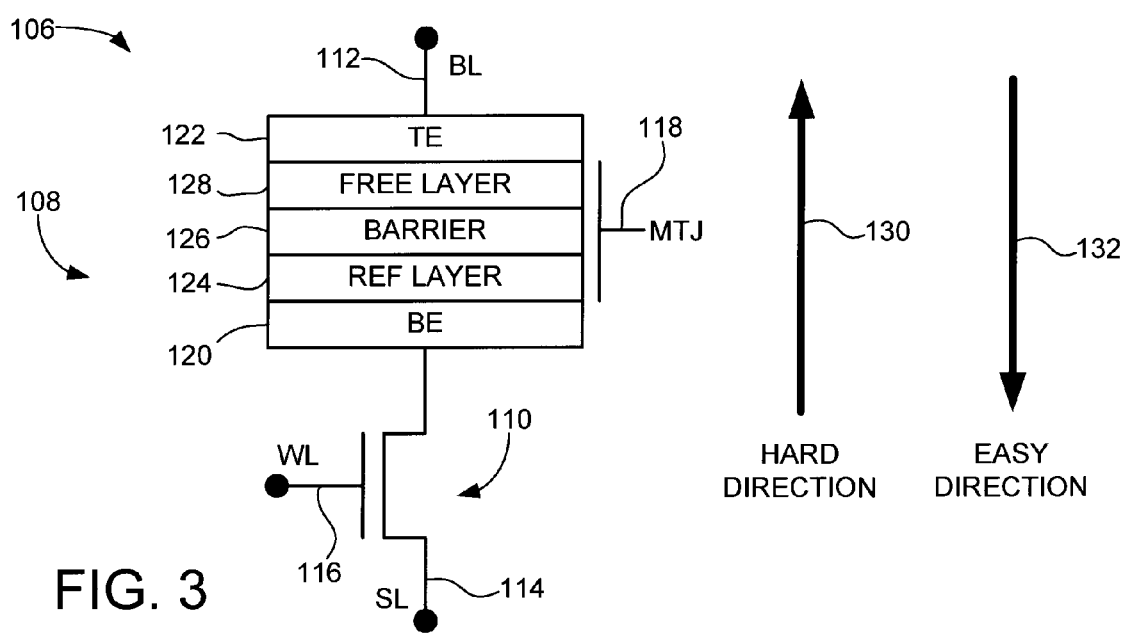
FIG. 3 shows an exemplary construction for a magnetic memory cell of FIG. 2.

FIG. 3 provides a vertical stack representation of a selected memory cell 106 from FIG. 2 in accordance with some embodiments. An MTJ 118 is separated by conductive top and bottom electrodes 120, 122 (TE and BE, respectively). The MTJ 118 includes a reference layer (RL) 124 with a fixed magnetic orientation in a selected direction. The reference layer 124 can take a number of forms, such as an antiferromagnetic pinned layer with the fixed magnetic orientation established by an adjacent pinning layer, such as a permanent magnet. A synthetic antiferromagnetic (SAF) structure may alternatively be used. A tunneling barrier layer 126 separates the reference layer 124 from a soft ferromagnetic free layer 128, also sometimes referred to as a storage layer.

The free layer 128 has a selectively programmable magnetic orientation that is established responsive to the application of write current to the element 108. The programmed magnetic orientation of the free layer 128 may be in the same direction as the orientation of the reference layer 124 (parallel), or may be in the opposing direction as the orientation of the reference layer 124 (antiparallel). Parallel orientation provides a lower resistance $R_L$ through the memory cell, and antiparallel orientation provides a higher resistance $R_H$ through the cell. Those skilled in the art will recognize that other MTJ configurations can readily be used, including stack configurations with multiple free and/or reference layers.

Memory cells such as 106 can have asymmetric write characteristics in that a greater driver effort can be required to switch to some programmed states as compared to other programmed states. FIG. 3 identifies a hard programming direction for the MTJ 118 by arrow 130, and an easy programming direction for the MTJ by arrow 132. The hard direction 130 corresponds to the direction of current flow through the cell 106 from SL 114 to BL 112 to switch the MTJ 118 from the parallel to the antiparallel state. The easy direction 132 corresponds to the direction of current flow from BL 112 to SL 114 to switch the MTJ 118 from the antiparallel state to the parallel state.

The current density to effect antiparallel switching (in the hard direction) can sometimes be significantly greater than the current density required to effect parallel switching (in the easy direction). While the current flow in the hard direction 130 is shown to be from SL to BL and the current flow in the easy direction 132 is shown to be from BL to SL, it will be recalled that the actual directions of electron flow during the application of these currents will be in the opposite direction. Thus, programming in the hard direction will direct electrons from the BL to the free layer, and programming in the easy direction will pass the electrons from the SL and through the reference layer to the free layer.

The relative ordering of the MTJ 118 and the switching device 110 within the memory cell 106 can also contribute to asymmetric write characteristics. It will be noted that in the hard programming direction 130, the write current traverses the drain-to-source channel of the MOSFET 110 prior to reaching the MTJ 118. The voltage presented to the MTJ 118 is thus substantially the voltage of the WL 116 (e.g., $V_{DD}$) minus the gate-to-source voltage $V_{GS}$ of the transistor. By contrast, in the easy programming direction 132 the write current passes through the MTJ 118 prior to the transistor 110, and the voltage presented to the MTJ 118 will be substantially the voltage of the BL 112 (e.g., $V_{DD}$). The transistor 110 will normally be sized to accommodate the largest magnitude of current required to switch the free layer without inducing either saturation or damage to the transistor.

Figure 4:
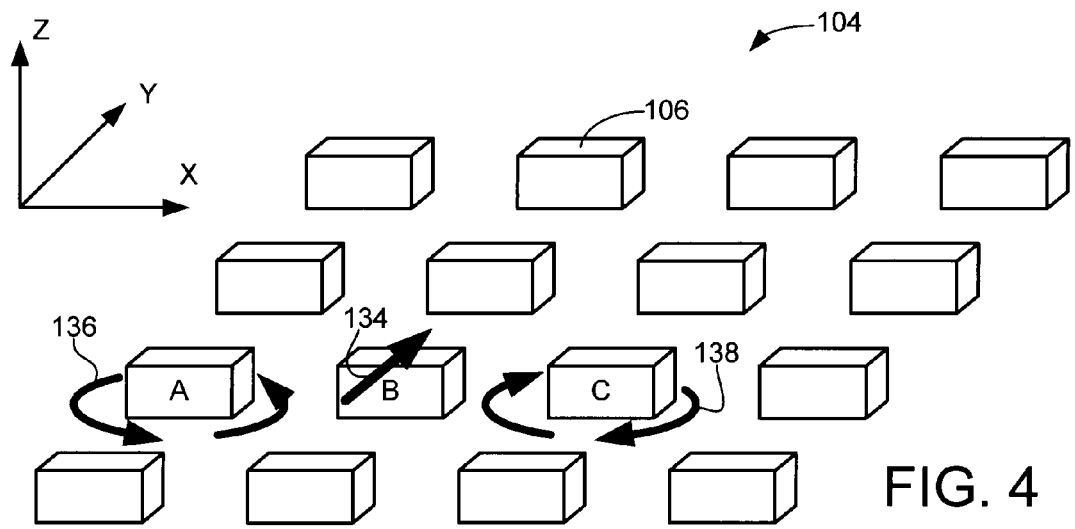
FIG. 4 is a functional diagram of a portion of the memory module to which field assisted writing is applied in accordance with some embodiments.

Because these switching current densities can be significant, various embodiments of the present invention operate the device 100 in such a way as to reduce the magnitude and duration of programming currents in both the hard and easy directions for each cell 106. FIG. 4 is a generalized representation of a number of memory cells 106 arranged in rows and columns along an x-y plane. The programmed states of the cells 106 are written by applying currents through the individual cells in the z-direction. It will be appreciated that the various depictions of memory cells and other elements in the drawings are merely generalized representations and so various other form factors, shapes, sizes, spacings, etc. can readily be utilized.

Three immediately adjacent cells 106 in FIG. 4 are denoted as cells A, B and C. In some embodiments, the writing of cell B to a selected state, such as the parallel state, is carried out by applying a suitable write current to cell B. Concurrently, field assist currents are applied to each of the adjacent cells A and C on opposing sides of cell B along an associated row (or column). The write current applied to cell B generates a magnetic field H which is denoted by arrow 134 and lies substantially along the Y axis. In at least some embodiments, the write current density will be insufficient in magnitude to precess the magnetization state of the free layer of cell B to the desired state.

However, the field assist currents applied to cells A and C are applied in opposing directions therethrough, with the field assist currents establishing respective Ampere fields 136 and 138 having opposing rotational directions. Because the fields 136, 138 pass adjacent the intermediary cell B in a same common direction, the net addition of these fields to the write current will be sufficient to switch of cell B to the desired state. It should be noted that the field assist currents applied to cells A and C may be of lower magnitude than the write current applied to cell B, and the field assist currents will not be of sufficient magnitude to switch the existing programmed states of cells A and C.

It has been found through empirical analysis that some types of magnetic memory cells having a size (diameter or cross-sectional span) of about 100 nanometers, nm can generate an Ampere field at the boundary of the memory cell with an energy level on the order of about 30 Oersteds, Oe responsive to application of a current density of about $10^7$ Amperes per square centimeter ($A/cm^2$). The strength of the Ampere field on an immediately adjacent memory cell located about 500 nm away may be reduced to a level on the order of about 3 Oe.

If two such fields are generated on opposing sides of a centrally disposed cell as with cells A, B and C in FIG. 4, the combined additive field passing through cell B may be on the order of about 6 Oe. This may constitute a significant portion of the overall field strength required to switch intermediary cell B. It will be appreciated that arranging the cells closer together would tend to increase the field strength experienced by the intermediary cell, all other factors being equal.

Figure 4A:
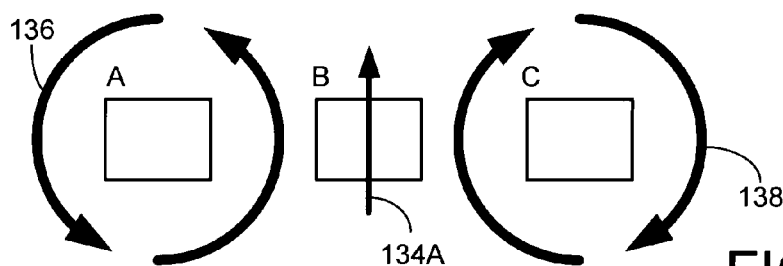
FIG. 4A is a top plan representation of cells from FIG. 4.

FIG. 4A is a generalized top plan representation of the cells A, B, and C from FIG. 4, showing the applied opposing fields 136, 138 and a combined additive field 134A generated therefrom. The field 134A adds to the field 134 in FIG. 4.

Figure 5:
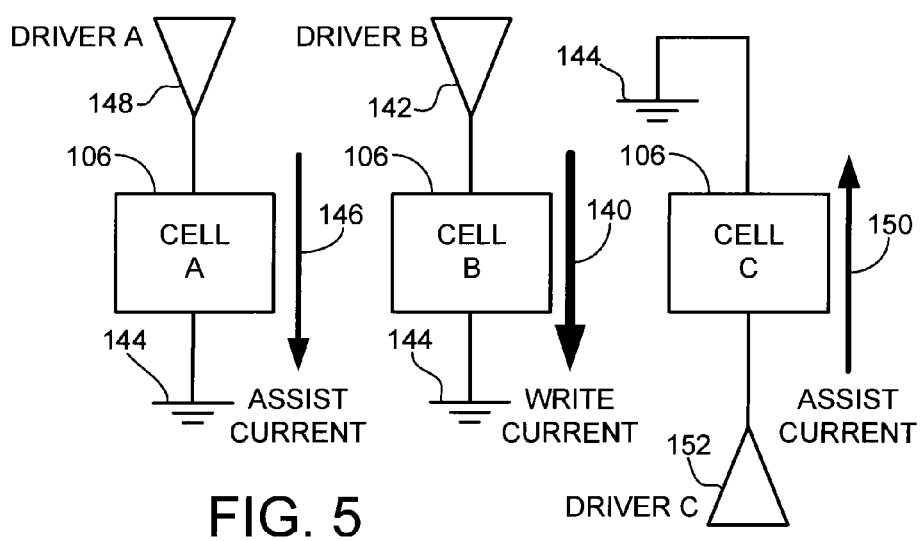
FIG. 5 shows respective currents applied to various cells in FIG. 4.

FIG. 5 is a side-by-side depiction of the cells A, B and C from FIG. 4. The write current applied to intermediary cell B is denoted by arrow 140 and is supplied by a write driver circuit (Driver B) 142. The write current passes through cell B to a reference line 144, such as electrical ground. A first field assist current 146 passes through adjacent cell A from a write driver circuit (Driver A) 148 to ground 144, and a second field assist current 150 passes through adjacent cell C from a write driver circuit (Driver C) 152 to ground 144. The respective directions and magnitudes of the various currents 140, 146 and 150 may vary depending on the requirements of a given application. By applying respective currents in this way, the sum of the neighboring Ampere fields combine with the write current to precess the intermediary cell to the desired state.

Figure 6:
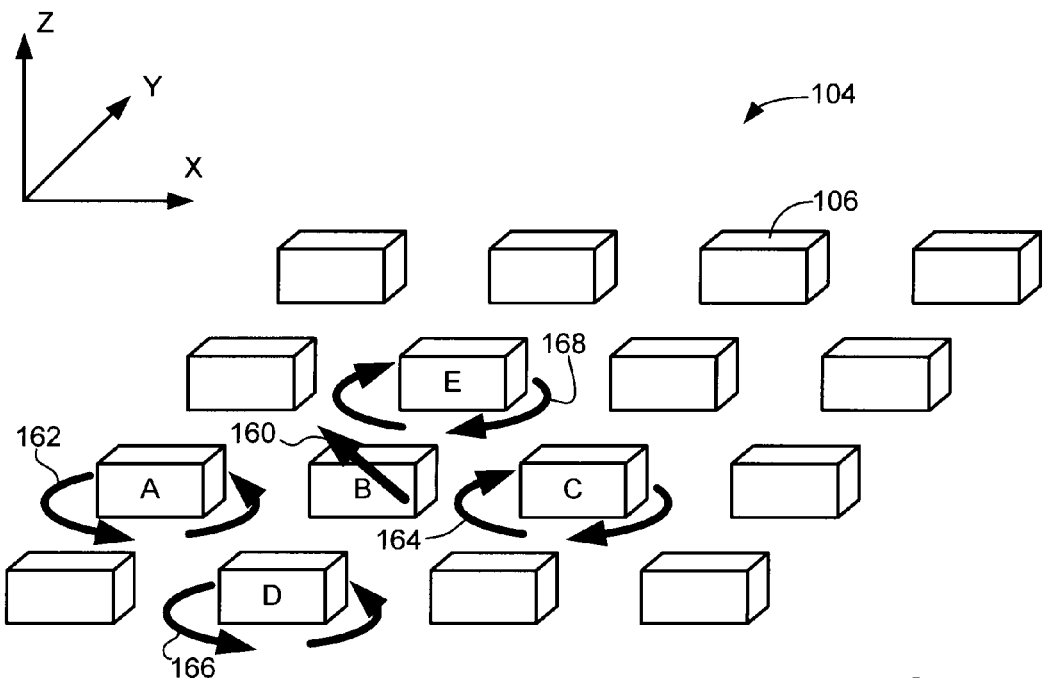
FIG. 6 is a functional diagram to show an alternative manner in which field assisted writing can be applied.

FIG. 6 shows the operation of the memory module 104 in accordance with further embodiments. As previously set forth in FIG. 4, FIG. 6 provides rows and columns of memory cells 106, with selected adjacent ones of the memory cells denoted as cells A, B, C, D and E. A write current is applied to cell B to set the magnetization of the free layer of cell B to a selected state, such as the antiparallel state. Arrow 160 denotes the H field generated during this write operation, with the field 160 rotated along the x-y plane about 45 degrees away from the y-axis.

The magnetization of cell B is assisted by the application of field assist currents to the respective cells A, C, D and E. These currents are applied in appropriate directions to establish associated rotational magnetic assist fields 162, 164, 166 and 168. These respective write currents and field assist currents are not shown in FIG. 6 to simplify the drawing, but the respective orientations of these currents in the z-direction can be determined from a review of FIG. 5. The assist fields from neighboring cells A, C, D and E operate upon the free layer of cell B by summing together to provide a net magnetic field that substantially points in the direction of the desired precession. Thus, these assist currents will tend to reduce the current density of the spin torque (write) current required to switch cell B to the desired state. It will be appreciated that any number of adjacent cells can be supplied with field assist currents, including cells that form an asymmetric pattern (e.g., three cells on one side of the cell to be programmed, etc.).

At this point it can be seen that reducing the magnitude of the spin current can allow the use of smaller (lower current capacity) switching devices 110, and may result in a reduction of the overall power consumption of the memory device. In other words, each switching device can be provided with sufficient current carrying capacity to accommodate the write current but can have insufficient current carrying capacity to accommodate a second write current sufficient to transition an associated MTJ to a selected programmed state without saturation of the switching device. Using the adjacent cells to generate the assist fields as disclosed herein eliminates the need to add further metallization to the array, such as in the form of conductors or other field generating structures to aid in the switching operation. A small amount of additional complexity to the overall circuit design may be required to allow the driver circuitry (see e.g., FIG. 5) to be able to output variable amounts of current for the various read, write and field assist operations on each cell.

It is contemplated that the magnitudes of the respective field assist currents may be adaptively adjusted to appropriate levels based on empirical analysis during manufacturing or subsequent field use. In some embodiments, different magnitudes of field assist current may be applied to the same cell in the same direction (e.g., the easy or hard direction) depending on which neighboring cell is being written at the time. The existing programmed state of a given cell receiving a write assist current may also influence the amount of assist current that is applied to that cell. The direction of the current flow (e.g., easy or hard direction) may also result in adjustments to the magnitude of the assist current; for example, a given cell may receive a greater write current magnitude if applied in the hard direction as compared to the easy direction to produce a given field strength in a neighboring cell.

While the embodiments discussed thus far have utilized the application of field assist currents to neighboring cells that are immediately adjacent the cell being programmed (e.g., cells A, C, D and E in relation to programmed cell B), such is not necessarily limiting. Field assist currents may additionally or alternatively be supplied to neighboring cells that are not immediately adjacent to the cell being programmed.

Figure 7:
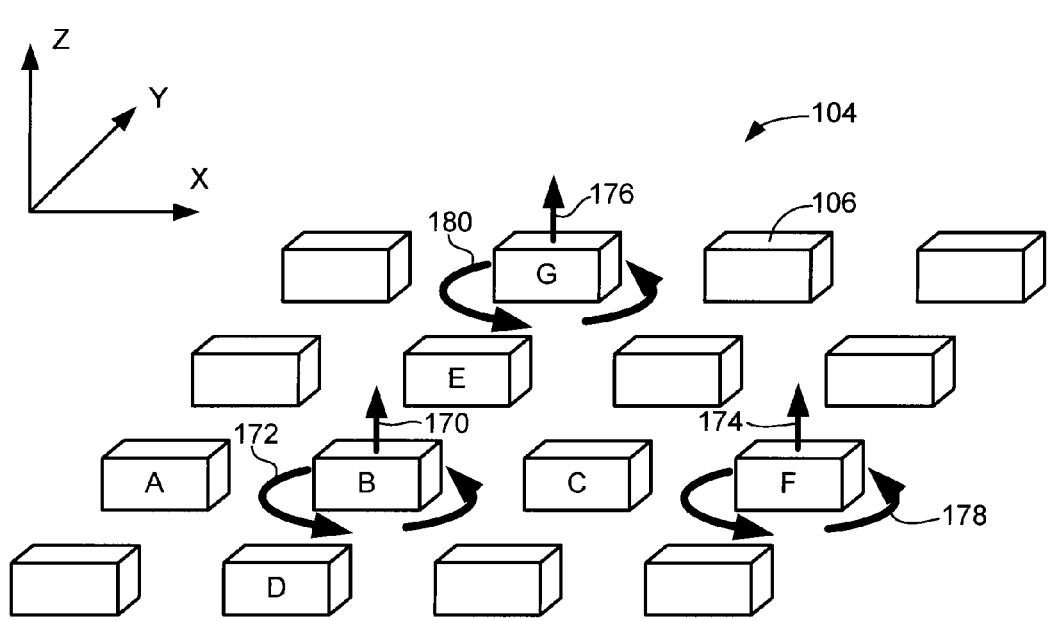
FIG. 7 is a functional diagram to show yet another manner in which field assisted writing can be applied.

By way of illustration, FIG. 7 shows the memory module 104 operated in accordance with further embodiments. The memory cells 106 are arranged into rows and columns as before, with various cells individually denoted as cells A, B, C, D, E, F and G. Cell B is being programmed to a selected state via application of a write current 170 in the hard direction. This write current establishes an Ampere field 172 which may operate upon the adjacent cells A, C, D and E. Field assist currents can be applied to these adjacent cells as described above. The final desired magnetization direction of cell B is not shown, but it may be as shown in FIG. 4 or 6.

Adjacent cells F and G respectively receive field assist currents 174, 176, which generate corresponding Ampere fields 178, 180. These Ampere fields 178, 180 are in opposing rotational direction to the Ampere field 172 generated by the write current 170 in cell B. Thus, field 178 will generally operate to cancel the effects of field 172 upon cell C, and field 180 will generally operate to cancel the effects of field 172 upon cell E.

The application of the field assist currents 174, 176 thus aid in the programming effort upon cell B, by allowing suitable write currents to be supplied to cell B without running the risk that the fringing field from cell B will inadvertently toggle the magnetization of an adjacent cell. In this way, whether or not additional currents are applied to cells A, C, D and E, the probability of these cells precessing to an undesired state is reduced. The application of the field assist currents 174, 176 can be particularly useful when the direction of field assist current applied to the adjacent cell (e.g., cell C) is in a direction opposite that of the currently programmed state.

Although not specifically shown in FIG. 7, it will be appreciated that field assist currents can be applied to other adjacent cells within the array, including the cells (not shown) on the opposite sides of cells A and D with respect to cell B, as well as any other suitable cell(s) within the array.

Figure 8:
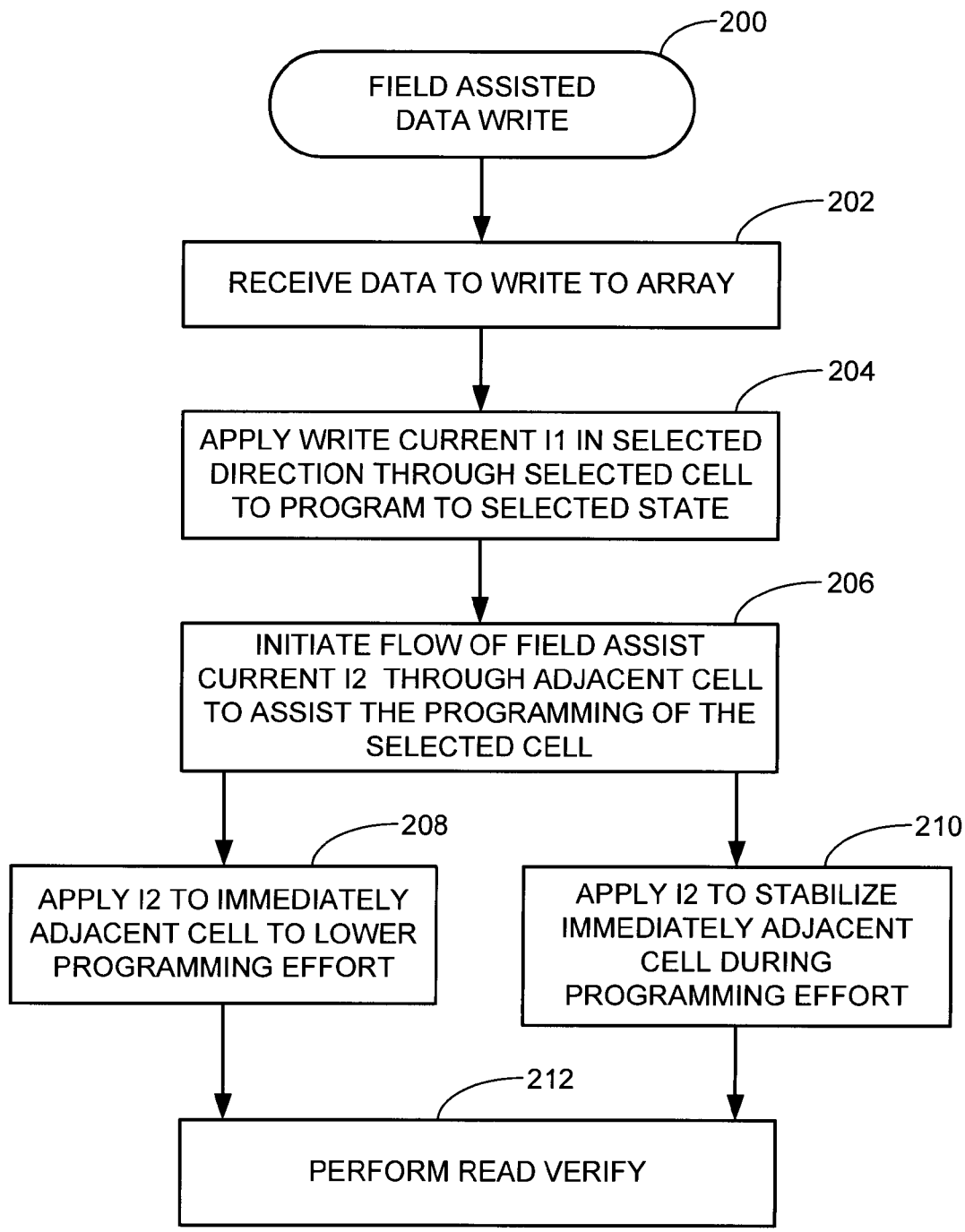
FIG. 8 is a flow chart for a FIELD ASSISTED DATA WRITE routine.

FIG. 8 provides a flow chart for a FIELD ASSISTED DATA WRITE routine 200, generally illustrative of steps carried out in accordance with various embodiments of the present invention. Data to be written to the array 104 are received at step 202, and the device 100 identifies various cells to be programmed to respective states in order to store the received data. For each selected cell, a suitable write current I1 is applied at step 204 to initiate the programming of the cell to the desired state. In some embodiments, the write current I1 will not have sufficient density to precess a free layer of the selected cell to the desired magnetization; for example, the density may only be, e.g., 80% or so of the requisite density.

At least one flow of field assist current I2 is concurrently initiated during the continued application of the write current I1 in step 206. The field assist current I2 is applied to an adjacent neighboring cell (e.g., cells A, C, D, E, F or G in FIG. 7). In many embodiments, separate field assist currents will be applied to multiple adjacent neighboring cells. The magnitude and direction of each of these field assist currents I2 will be selected to promote the programming of the selected cell in step 204.

In some embodiments, as shown by step 208 the assist current I2 is applied to an immediately adjacent cell, such as cells A, C, D or E in FIG. 6. In this way, the assist current generates an Ampere field which acts upon the selected cell to aid in the precession of that cell to the desired state.

Alternatively, the assist current I2 can instead be applied as shown by step 210 to a neighboring adjacent cell that is spaced apart from the selected cell of step 204 by at least one intervening cell (e.g., cells F or G which are spaced from cell B by cells C and E, respectively). In this latter case, the assist current establishes a field that helps to stabilize the intervening cell.

As desired, a read-verify operation may be carried out upon the cell at step 212 to determine whether the cell achieved the desired state. However, the various techniques applied herein may operate to enhance the probability that the selected cell magnetically precessed to the desired final state, making such read verify operations unnecessary during normal operation.

The various write and field assist currents are applied to the respective cells responsive to suitable control circuitry, such as the controller 102 shown in FIG. 1. Alternatively or additionally, the control circuitry may form a portion of the memory module and may include various current and/or voltage drivers of the type represented in FIG. 5.

It will now be appreciated that the various embodiments presented hereinabove can provide a number of benefits in the writing of data to magnetic memory cells. The use of field assisted magnetic precession writing as described herein can significantly improve the probability that the memory cell will achieve the desired written state in one write attempt. The Ampere fields can reduce the duration and magnitude of the required write current pulse, thereby at least potentially providing faster data access operations with lower overall power consumption requirements. Smaller switching devices and/or higher data areal densities may also be achievable through the use of these techniques.

The various embodiments disclosed herein are suitable for use in a write-once or write many memory. While STRAM memory cells have been used as an illustrative embodiment, the present disclosure is not so limited, as any number of different types of magnetic element constructions can incorporate the above techniques, including other types of solid-state memories and rotatable magnetic memories.

For purposes of the appended claims, reference to the initiation of a precession of the magnetic state of a memory cell will not necessarily require an actual change in said magnetic state, but will instead refer to the initiation of said process.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
providing an array of magnetic memory cells, each magnetic memory cell comprising a resistive sense memory element and a separate switching device;
applying a write current through a selected magnetic memory cell in the array to initiate magnetic precession of the selected cell to a desired magnetic state, wherein the applied write current passes through the resistive sense memory element and switching device of the selected magnetic memory cell; and
concurrently flowing a field assist current through the resistive sense memory element and switching device of an adjacent memory cell in the array to generate a magnetic field that assists in said precession of the selected cell to the desired magnetic state, the field assist current passing in a direction through the resistive sense memory element and switching device of the adjacent memory cell based on the desired magnetic state of the selected memory cell.

2. The method of claim 1, in which the write current passes through the resistive sense memory element and the switching device of the selected memory cell in a first axial direction, and the field assist current passes through the resistive sense memory element of the adjacent memory cell in a second axial direction parallel to the first axial direction.

3. The method of claim 1, in which the adjacent memory cell is characterized as a first adjacent memory cell, the field assist current is characterized as a first field assist current and the magnetic field is characterized as a first rotational assist field, and the concurrently flowing step further comprises concurrently flowing a second field assist current through a second adjacent memory cell in the array to generate a second rotational assist field wherein the first and second rotational assist fields pass through the selected cell to aid in the precession of the selected cell to the desired magnetic state.

4. The method of claim 3, in which the first rotational assist field rotates in a first rotational direction and the second rotational assist field rotates in a second rotational direction opposite the first rotational direction.

5. The method of claim 4, in which the first and second adjacent memory cells are aligned along a selected row in the array with the selected cell positioned along said selected row between the first and second adjacent memory cells.

6. The method of claim 1, in which the selected cell comprises a spin-torque transfer random access memory (STRAM) memory cell comprising a magnetic tunneling junction with a reference layer and a free layer separated from the reference layer by a tunneling barrier layer, the reference layer having a fixed magnetic orientation and the free layer having a variable magnetic orientation that can be switched between a parallel orientation and an antiparallel orientation with respect to the reference layer, and in which the write current and the magnetic field cooperatively operate to precess the free layer to said desired magnetic state.

7. The method of claim 1, in which an intermediary memory cell is disposed between the selected cell and the adjacent cell in the aray, and the magnetic field established by the field assist current is in a rotational direction in opposition to a magnetic field generated by the write current thereby stabilizing an existing magnetic orientation of said intermediary cell.

8. The method of claim 1, in which the direction of the field assist current through the adjacent cell is further selected irrespective of the existing magnetic state of the adjacent cell.

9. The method of claim 1, in which the write current applied during the applying step has a magnitude insufficient to complete said magnetic precessing to the desired magnetic state.

10. An apparatus comprising:
an array of non-volatile magnetic data storage cells each individually comprising a resistive sense memory element and a switching device, each of the resistive sense memory elements programmable to a selected magnetic orientation; and control circuitry adapted to apply a write current through the resistive sense memory element and the switching device of the selected cell of said array to initiate magnetic precession of a magnetic layer of the resistive sense memory element of the selected cell to a desired magnetic orientation, and to concurrently apply a field assist current through the resistive sense memory element and the switching device of an adjacent memory cell of the array to generate a magnetic field that assists in said precession of the magnetic layer to the desired magnetic state, the field assist current having a direction through the adjacent memory cell responsive to the desired magnetic orientation of the selected cell and independent of the existing magnetic orientation of the adjacent memory cell.

11. The apparatus of claim 10, in which the switching device in each of the memory cells in the array is characterized as a transistor connected in series to the associated resistive sense memory element.

12. The apparatus of claim 10, in which the selected cell comprises a spin-torque transfer random access memory (STRAM) memory cell with the resistive sense memory element comprising a magnetic tunneling junction having a reference layer and a free layer separated from the reference layer by a tunneling barrier layer, the reference layer having a fixed magnetic orientation and the free layer corresponding to the magnetic layer and having a variable magnetic orientation that can be switched between a parallel orientation and an antiparallel orientation with respect to the reference layer, and in which the write current and the magnetic field cooperatively precess the free layer to said desired magnetic orientation.

13. The apparatus of claim 10, in which an intermediary memory cell is disposed between the selected cell and the adjacent cell, and the magnetic field established by the field assist current is in a rotational direction in opposition to a magnetic field generated by the write current thereby stabilizing an existing magnetic orientation of said intermediary cell.

14. The apparatus of claim 10, in which the field assist current has a magnitude insufficient to change an existing magnetic orientation of the resistive sense magnetic element of the adjacent memory cell.

15. The apparatus of claim 10, characterized as a portable memory card.

16. The apparatus of claim 10, in which each of the cells in said array comprise a magnetic tunneling junction (MTJ) programmable to a selected electrical resistance responsive to a programmed magnetic orientation of a free layer thereof, each of the cells in said array further comprising a switching device connected in series to the MTJ to provide selective access to the associated cell by a control line connected to a gate structure of the switching device, each said switching device of sufficient current carrying capacity to accommodate said write current but having insufficient current carrying capacity to accommodate a second write current sufficient to transition the associated MTJ to a selected programmed state without saturation of said switching device.

17. An apparatus comprising a portable memory card having a memory module comprising an array of non-volatile magnetic memory cells and a control circuit adapted to program the memory cells to different electrically resistive states to store data therein, each of the memory cells comprising a separate resistive sense memory element in series with a separate switching device, the control circuit further adapted to pass a field assist current through the resistive sense memory element and the switching device of a first selected cell in said array concurrently with the passage of a write current through the resistive sense memory element and the switching device of a neighboring second selected cell in said array, the field assist current operating to generate an assist magnetic field adapted to cooperate with said write current to program the second selected cell to a selected resistive state, the field assist current having a direction through the first selected cell responsive to the selected resistive state of the second selected cell and independent of an existing resistive state of the first selected cell.

18. The apparatus of claim 17, in which array comprises an array of spin-torque transfer random access memory (STRAM) memory cells each having a reference layer and a free layer separated from the reference layer by a tunneling barrier layer, the reference layer having a fixed magnetic orientation and the free layer having a variable magnetic orientation that can be switched between a parallel orientation and an antiparallel orientation with respect to the reference layer, and in which the write current and the assist magnetic field cooperatively precess the free layer of the second selected cell to a selected one of the parallel or antiparallel orientations.

19. The apparatus of claim 17, in which the write current provides a current density through the second selected cell insufficient to complete precession of the second selected cell to the selected programmed state without the assist magnetic field from the first selected cell.

20. The apparatus of claim 17, in which field assist currents are concurrently applied to a plurality of additional memory cells adjacent the first and second selected cells to generate a corresponding plurality of additional assist magnetic fields adapted to cooperate with the write current to program the second selected cell to the selected programmed state.

21. The apparatus of claim 17, in which the field assist current sequentially passes through the resistive sense memory element and the switching device of the first selected cell and the write current sequentially passes through the resistive sense memory element and the switching device of the second selected cell.

22. The method of claim 1, in which the array is characterized as a cross point array so that each memory cell is connected to a total of two control lines.

23. The method of claim 1, in which the separate switching device in each of the memory cells in the array is characterized as a transistor so that each memory cell is connected to a total of three control lines.

* * * * *

UNITED STATES PATENT AND TRADEMARK OFFICE
CERTIFICATE OF CORRECTION

PATENT NO.          : 8,830,734 B2                              Page 1 of 1
APPLICATION NO.     : 12/950673
DATED               : September 9, 2014
INVENTOR(S)         : Andreas Karl Roelofs et al.

It is certified that error appears in the above-identified patent and that said Letters Patent is hereby corrected as shown below:

In the Claims

In Col. 8, Line 53
replace "aray"
with "array"

Signed and Sealed this
Thirty-first Day of March, 2015

Michelle K. Lee
*Director of the United States Patent and Trademark Office*